United States Patent
Lai

(10) Patent No.: US 9,281,450 B2
(45) Date of Patent: Mar. 8, 2016

(54) METHOD FOR MANUFACTURING LED DIE

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 14/698,792

(22) Filed: Apr. 28, 2015

(65) Prior Publication Data

US 2015/0325753 A1 Nov. 12, 2015

Related U.S. Application Data

(62) Division of application No. 13/935,530, filed on Jul. 4, 2013, now Pat. No. 9,048,351.

(30) Foreign Application Priority Data

Dec. 24, 2012 (TW) .............................. 101149434 A

(51) Int. Cl.
  *H01L 33/46* (2010.01)
  *H01L 33/20* (2010.01)
  *H01L 33/38* (2010.01)

(52) U.S. Cl.
  CPC ............... *H01L 33/46* (2013.01); *H01L 33/20* (2013.01); *H01L 33/38* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | | | |
|---|---|---|---|---|
| 2002/0134987 | A1* | 9/2002 | Takaoka | G02B 6/4202 257/98 |
| 2004/0188689 | A1* | 9/2004 | Shono | H01L 33/387 257/79 |
| 2011/0297953 | A1* | 12/2011 | Lai | H01L 33/20 257/76 |

* cited by examiner

*Primary Examiner* — Yasser A Abdelaziez
(74) *Attorney, Agent, or Firm* — Novak Druce Connolly Bove + Quigg LLP

(57) ABSTRACT

A method for manufacturing an LED die includes following steps: a semi-finished LED die is provided; an N-type layer, an active layer, and an P-type layer are sequentially formed on the transparent substrate; the transparent substrate is etched by laser to form a light outputting surface, the light outputting surface having a smoothly concave and arc-shaped configuration; common parts of the active layer and the P-type layer are removed to expose a part of the N-type layer; and an electrode structure is disposed on exposed N-type layer and the p-type layer to complete the formation of the LED die.

6 Claims, 4 Drawing Sheets

METHOD FOR MANUFACTURING LED DIE

CROSS-REFERENCE TO RELATED APPLICATIONS

This patent application is a divisional application of patent application Ser. No. 13/935,530, filed on Jul. 4, 2013, entitled "LED DIE, METHOD FOR MANUFACTURING THE LED DIE AND AUTOMOBILE LAMP HAVING THE LED DIE", assigned to the same assignee, which is based on and claims priority from Taiwan Patent Application No. 101149434, filed in Taiwan on Dec. 24, 2012, and disclosures of both related applications are incorporated herein by reference in their entireties.

BACKGROUND

1. Technical Field

The present disclosure generally relates to semiconductor structure, and particularly to an LED (light emitting diode) die, a method for manufacturing the LED die and an automobile lamp having the LED die.

2. Description of the Related Art

LEDs have many advantages, such as high luminosity, low operational voltage, low power consumption, compatibility with integrated circuits, faster switching, long term reliability, and environmental friendliness which have promoted their wide use as a light source.

A typical automobile lamp structure includes an LED light source, a reflecting shell, a shading portion and a lens. The LED light source generally generates light with different brightness in a radiation angle, which leads to the LED light source and the lens can not be directly engaged together to obtain a light source with evenly brightness. Accordingly, light emitted from the LED light source should be reflected by the reflecting shell and converged to the shading portion firstly. The light is regulated to a preset shape and radiate to ambient environment through the lens. However, the reflecting shell enlarges a volume of the automobile lamp structure and increases a manufacturing cost of the automobile lamp structure.

Therefore, it is desirable to provide an automobile lamp which can overcome the above-described problems.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present automobile lamp structure. Moreover, in the drawings, all the views are schematic, and like reference numerals designate corresponding parts throughout the views.

DETAILED DESCRIPTION

Figure 1:
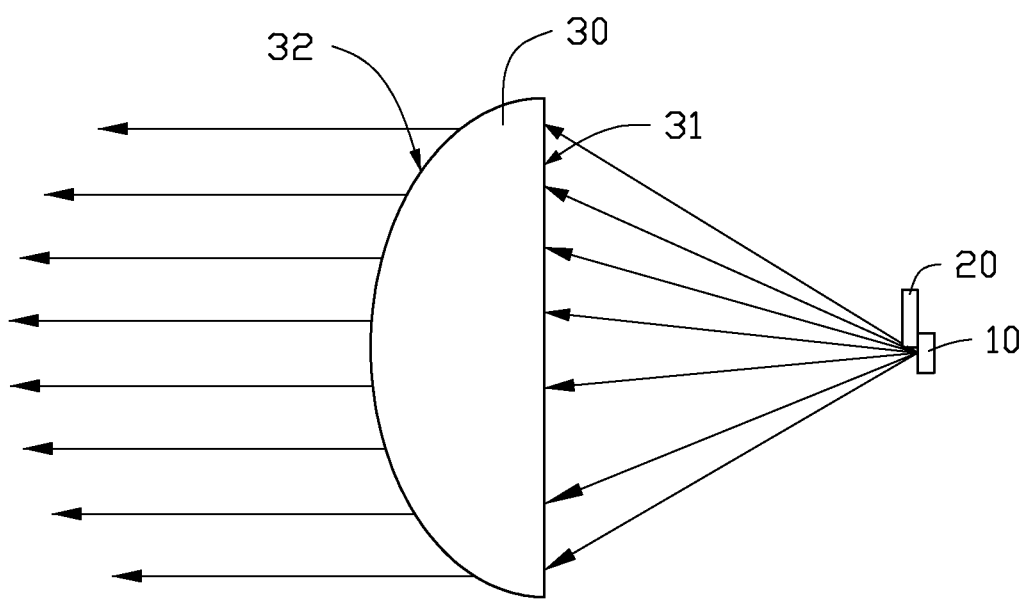
FIG. 1 is a schematic view of an automobile lamp in accordance with an exemplary embodiment of the present disclosure.

Referring to FIG. 1, an automobile lamp 100 in accordance with an embodiment is provided. The automobile lamp 100 includes a light source 10, a shading portion 20 and a lens 30.

Figure 2:
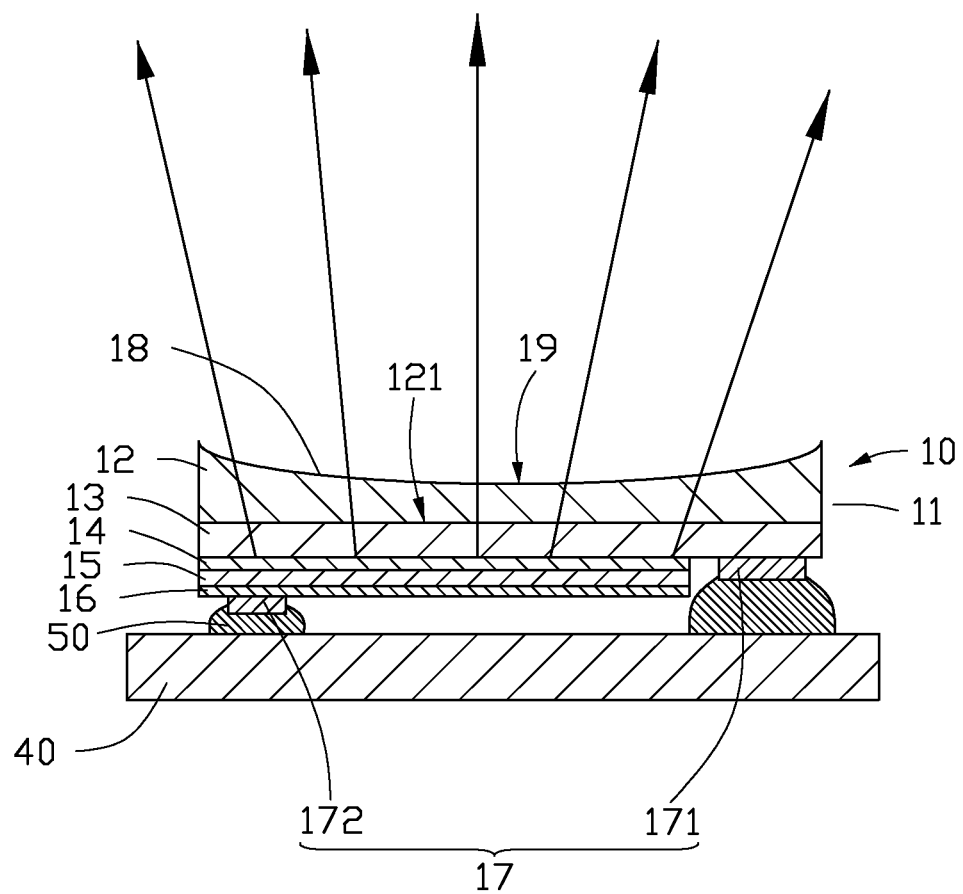
FIG. 2 is a cross-sectional view of an LED die of the automobile lamp of FIG. 1.

Specifically, referring to FIG. 2, the light source 10 is an LED package and includes an LED die 11 and a packing structure (not shown) engaging with the LED die 11. The LED die 11 includes a transparent substrate 12, an N-type layer 13, an active layer 14, a P-type layer 15, a reflective layer 16 successively arranged along a top-to-bottom direction to the LED die 11, and an electrode structure 17 mounted on a bottom of the LED die 11.

Figure 3:
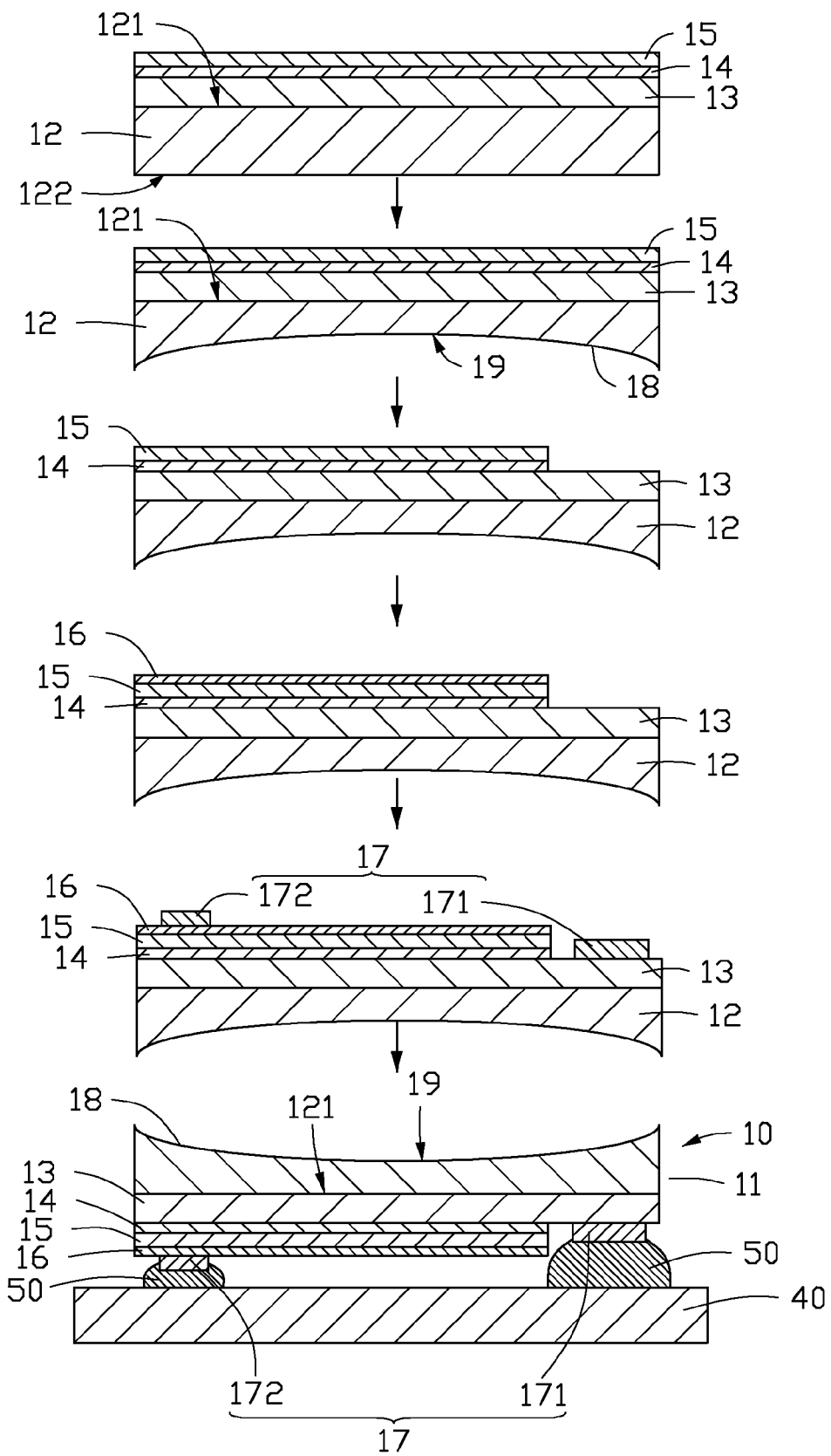
FIG. 3 shows steps of forming the LED die of the automobile lamp of FIG. 2.

The transparent substrate 12 is electrically insulating. Referring to FIG. 3, the transparent substrate 12 includes a first surface 121 and a second surface 122 opposite to the first surface 121. The second surface 122 is etched by laser to act as a light outputting surface 18. The light outputting surface 18 is concave. In this embodiment, the light outputting surface 18 is a smooth, arc-shaped structure. The transparent substrate 12 is made of sapphire.

The N-type layer 13, the active layer 14, the P-type layer 15 and the reflective layer 16 are successively arranged on the first surface 121. In this embodiment, the N-type layer 13 is an N-type GaN layer. The active layer 14 is a multiple quantum well (MQW) GaN/InGaN layer. The P-type layer 15 is a P-type GaN layer. Common ends of the active layer 14 and the P-type layer 15 are removed to expose a part of the N-type layer 13. The reflective layer 16 is flat and formed on a bottom surface of the P-type layer 15 to reflect light emitting from the active layer 14 for strengthening light outputting efficiency of the LED die 11.

The electrode structure 17 includes an N-electrode 171 and a P-electrode 172. The N-electrode 171 is arranged on the N-type layer 13, the P-type layer 172 is arranged on an edge of the reflective layer 16. The N-electrode 171 is above of the P-electrode 172. The N-electrode 171 and the P-electrode 172 electrically connect with a printed circuit board (PCB) 40 via solders 50. Light emitted from the light source 10 radiates out via the light outputting surface 18. The light outputting surface 18 diverges light from the active layer 14 when the light radiates through the light outputting surface 18.

The shading portion 20 is arranged between the light source 10 and the lens 30. A shape of the shading portion 20 is designed according to a luminance shape generated by the automobile lamp 100. Specifically, the shading portion 20 includes a side surface, and a shape of the side surface is the same as a cut-off line which complies with relevant law and regulations. When the light from the light source 10 reaches the shading portion 20, a part of the light is blocked by the shading portion 20, and the other part of the light passing through the shading portion 20 is regulated thereby to have a preset luminance shape with a cut-off line formed by the side surface. That is the shading portion 20 provides a cut-off line to regulate light generated by the light source 10 to the preset luminance shape. Thereafter, the light having the preset luminance shape radiates to ambient environment via the lens 30.

The lens 30 is a convex lens. The lens 30 includes a plane incident surface 31 and a convex light-emitting surface 32 protruding from a periphery of the incident surface 31 away from the shading portion 20. The light outputting surface 18 of the light source 10 directly faces the incident surface 31. The lens 30 is spaced from the shading portion 20 and the light source 10. The convex light-emitting surface 32 is a spherical surface.

When the automobile lamp 100 works, light radiates from the light outputting surface 18 and is diverged therefrom. As such, light generated by the light source 10 can be directly transmitted to the shading portion 20 and regulated to a preset luminance shape with the cut-off line and radiate to ambient environment via the lens 30. Accordingly, the automobile lamp 100 has a smaller volume since it can eliminate the necessity of a reflecting shell and the manufacturing cost of the automobile lamp 100 is accordingly decreased.

The disclosure provides a method for manufacturing the automobile lamp 100 which includes following steps:

Referring to FIG. 3, from top to bottom, first, a green LED die (not labeled) is provided, which includes a transparent substrate 12, and an N-type layer 13, an active layer 14 and a P-type layer 15 arranged on the transparent substrate 12 in sequence.

The transparent substrate 12 is electrically insulating includes a first surface 121 and a second surface 122 opposite to the first surface 121. The transparent substrate 12 can be made of materials such as sapphire, SiC, Si or GaN and so on. In this embodiment, the substrate 12 is made of sapphire. The N-type layer 13, the active layer 14 and the P-type layer 15 are successively formed on the first surface 121.

Figure 4:
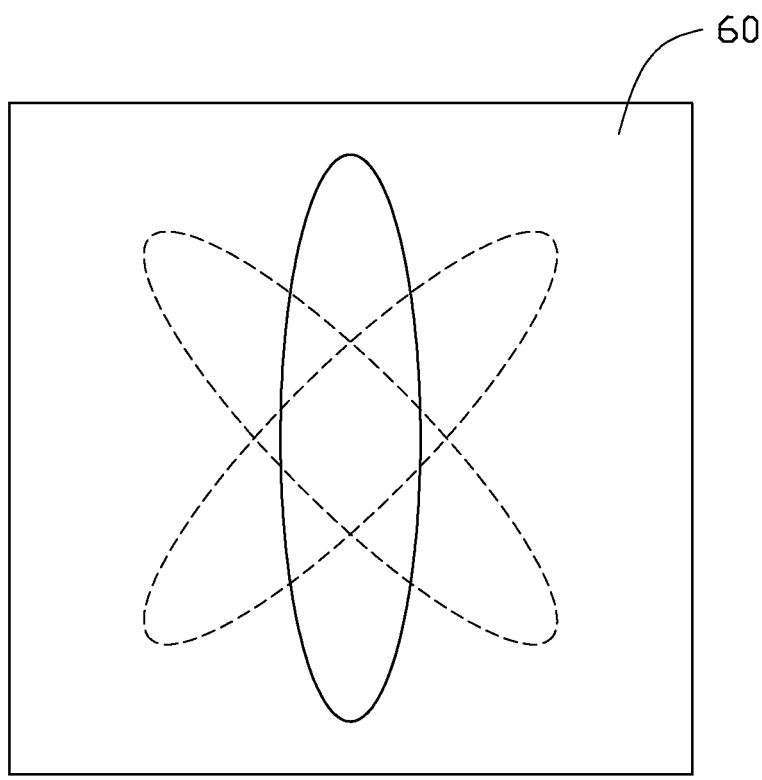
FIG. 4 is a schematic view of a light mask for laser etching the light outputting surface of the LED die in the automobile lamp of FIG. 2.

Referring to FIG. 4, a laser source (not shown) matching a mask 60 is provided to etch the second surface 122 to form the light outputting surface 18, wherein the light outputting surface 18 has a smoothly concave, arc-shaped configuration. Specifically, the mask 60 is square and a patterned zone 61 is defined in a center of the mask 60. The patterned zone 61 is a void and is elliptical in shape. The laser permeates through the patterned zone 61 of the mask 60 to etch the second surface 122 to form the light outputting surface 18, during which the green LED die is rotated under to the mask 60. Accordingly, the light outputting surface 18 is formed. In this embodiment, the laser is a KrF excimer laser with a small energy applying to the second surface 122 to precisely process the second surface 122. Since the light outputting surface 18 is etched and formed by laser etching, the arc-shaped light outputting surface 18 can be easily formed; should the light outputting surface 18 be formed by a traditional etching method, for example, chemical etching, the arc-shaped configuration cannot be easily formed, since the traditional etching method is more suitable and likely to from a recess with a right-angled or a beveled edge.

Common ends of the active layer 14 and the P-type layer 15a are then removed to expose a part of the N-type layer 13. A reflective layer 16 is formed on the P-type layer 15. A size of the reflective layer 16 is equal to that of the P-type layer 15. In this embodiment, the reflective layer 13 is formed by plasma enhanced chemical vapor deposition method. The electrode structure 17 is arranged on the green LED die to complete the formation of the LED die 11. Specifically, the N-electrode layer 171 is arranged on the exposed surface of the N-type layer 13, and the P-electrode 172 is arranged on the reflective layer 16 at an edge thereof away from the N-electrode 171. Accordingly, the LED die 11 is formed.

The LED die 11 is then reversed. The N-electrode 171 and the P-electrode 172 of the LED die 11 are soldered and electrically connected to the PCB 40. Alternatively, a packing structure such as a resin with/without fluorescent particles doped therein can be used to encapsulate the LED die 11 to form the LED light source 10 after the LED die 11 is reversed.

The lens 30 is provided and spaced from the LED light source 10. The incident surface 31 of the lens 30 is arranged to directly face the light outputting surface 18 of the LED die 11 of the LED light source 10.

The shading portion 20 is arranged between the LED light source 10 and the lens 30 to regulate the luminance shape generated by the LED die 11.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. A method for manufacturing an LED die comprising steps:
   providing a semi-finished LED die comprising a transparent substrate with a first surface and a second surface opposite to the first surface; sequentially forming an N-type layer, an active layer, and an P-type layer on the first surface of the transparent substrate;
   etching the second surface of transparent substrate by laser to form a light outputting surface, the light outputting surface having a smoothly concave and arc-shaped configuration;
   removing common parts of the active layer and the P-type layer to expose a part of the N-type layer; and
   disposing an electrode structure on exposed N-type layer and the p-type layer to complete the formation of the LED die.

2. The method for manufacturing the LED die of claim 1, in the step of etching the second surface comprising:
   providing a mask with a patterned zone formed at a center of the mask;
   applying the laser to permeate through the patterned zone of the mask to reach and etch the second surface, during which the LED die is rotated under the mask.

3. The method for manufacturing the LED die of claim 2, wherein the laser is a KrF excimer laser.

4. The method for manufacturing the LED die of claim 2, wherein the patterned zone is void and is elliptical in shape.

5. The method for manufacturing the LED die of claim 1, further comprising a step of forming a reflective layer on the P-type layer, wherein the reflective layer is formed by plasma enhanced chemical vapor deposition.

6. The method for manufacturing the LED die of claim 5, wherein the electrode structure comprises a P-electrode and an N-electrode, the P-electrode being mounted on the reflective layer, the N-electrode being mounted on the exposed N-type layer.

* * * * *